(12) United States Patent
Cimaz (10) Patent No.: US 11,630,665 B2
(45) Date of Patent: Apr. 18, 2023

(54) DEVICE AND METHOD FOR A FREQUENCY MODULATED SIGNAL

(71) Applicant: STMicroelectronics (Grand Ouest) SAS, Le Mans (FR)

(72) Inventor: Lionel Cimaz, Pleumeleuc (FR)

(73) Assignee: STMicroelectronics (Grand Ouest) SAS, Le Mans (FR)

( * ) Notice: Subject to any disclaimer, the term of this patent is extended or adjusted under 35 U.S.C. 154(b) by 0 days.

(21) Appl. No.: 17/404,835

(22) Filed: Aug. 17, 2021

(65) Prior Publication Data
US 2022/0066774 A1    Mar. 3, 2022

(30) Foreign Application Priority Data

Aug. 31, 2020    (FR) ..................................... 2008835

(51) Int. Cl.
*G06F 9/22*     (2006.01)
*G06F 9/30*     (2018.01)
*H03K 5/135*    (2006.01)

(52) U.S. Cl.
CPC .......... *G06F 9/223* (2013.01); *G06F 9/30189* (2013.01); *H03K 5/135* (2013.01)

(58) Field of Classification Search
CPC ..... G06F 9/223; G06F 9/30189; H03K 5/135; H03K 5/133; H03K 5/134; H03K 17/223; H03K 17/28; H03K 17/284; H02J 7/02; H02J 50/10; H02J 7/00; H02J 50/20; H04B 5/0037; H04B 5/0075; H04L 25/4904

See application file for complete search history.

(56) References Cited

U.S. PATENT DOCUMENTS

2017/0149291 A1    5/2017  Iwasaki et al.
2020/0393868 A1*  12/2020  Oh ......................... H03K 3/017

OTHER PUBLICATIONS

IEC, "The Qi wireless power transfer system power class 0 specification—Parts 1 and 2: Interface Definitions", IEC PAS 63095.1, Edition 1.0, May 2017, 164 pages.

* cited by examiner

*Primary Examiner* — Jung Kim
(74) *Attorney, Agent, or Firm* — Slater Matsil, LLP (57) ABSTRACT

A method executes instructions, each corresponding to switching a signal, a delay, and a condition selected among first, second, or third conditions. Each execution includes performing, after the delay, switching the signal if the condition is the first condition, if the condition is the second condition and a flag is in an active state, or if the condition is the third condition and the flag is in an inactive state, or not switching the signal if the condition is the second condition and the flag is in the inactive state, or if the condition is the third condition and the flag is in the active state. A first instruction represents a first switching of a first signal, a first delay, and the second condition, and is immediately followed by a second instruction representing the first switching of the first signal, a second delay, and the third condition.

22 Claims, 3 Drawing Sheets

DEVICE AND METHOD FOR A FREQUENCY MODULATED SIGNAL

CROSS-REFERENCE TO RELATED APPLICATIONS

This application claims the benefit of French Patent Application No. 2008835, filed on Aug. 31, 2020, which application is hereby incorporated herein by reference.

TECHNICAL FIELD

The present disclosure generally concerns electronic circuits and methods, and more particularly electronic circuits and methods for transmitting a frequency-modulated radio frequency signal.

BACKGROUND

Electronic circuits or devices capable of transmitting data or information via a frequency-modulated radio frequency signal are known. Such circuits each comprise an antenna and a control circuit configured to supply the antenna with a frequency-modulated radio frequency signal to be transmitted to another circuit. Among such circuits, circuits also capable of transmitting a wireless supply power to another device, via an electromagnetic field emitted by their antennas and received by an antenna of the device to be powered, are known. In such circuits, the emission of the frequency-modulated radio frequency signal enables to transmit information to the device to be powered, for example, to establish the wireless supply power to be delivered to the device to be powered.

SUMMARY

There is a need to overcome at least some of the disadvantages of known electronic circuits capable of transmitting a frequency-modulated radio frequency signal.

For example, there is a need to overcome at least certain disadvantages of known electronic circuits capable of transmitting a frequency-modulated radio frequency signal and of supplying a wireless power supply to a device to be powered.

An embodiment overcomes all or part of the disadvantages of known electronic circuits capable of transmitting a frequency-modulated radio frequency signal.

An embodiment overcomes all or part of the disadvantages of known electronic circuits capable of transmitting a frequency-modulated radio frequency signal and of transmitting a wireless power supply to a device to be powered.

An embodiment provides a method of execution of a set of successive instructions, wherein each instruction corresponds to a switching of a signal, a delay, and a condition selected among a first, a second, and a third conditions, each execution of an instruction comprises performing, when the delay has expired, the switching of the signal if the condition is the first condition, if the condition is the second condition and a flag is in an active state, and if the condition is the third condition and the flag is in an inactive state, and not performing the switching if the condition is the second condition and the flag is in the inactive state, and if the condition is the third condition and the flag is in the active state, and a first instruction is representative of a first switching of a first signal, of a first delay, and of the second condition and is immediately followed by a second instruction representative of the first switching of the first signal, of a second delay, and of the third condition.

An embodiment provides a device capable of implementing the above method, comprising a storage circuit having the set of instructions recorded therein, and a processing circuit configured to execute the instructions one after the others.

According to an embodiment, a plurality of executions of the set of instructions are implemented one after the others.

According to an embodiment, each full execution of the set of instructions corresponds to a cycle of the first signal, the first signal being periodic.

According to an embodiment, a current state of the flag is updated each time a given number of cycles of the first signal is reached, the given number being preferably equal to 256.

According to an embodiment, next successive states of the flag a stored in a queue.

According to an embodiment, the device comprises a counter configured to count the given number of cycles of the first signal and to indicate that this given number of cycles has been reached, the device being configured to update the flag when the given number of cycles has been reached.

According to an embodiment, the active state of the flag determines a frequency of the first signal and the inactive state of the flag determines another frequency of the first signal.

According to an embodiment, a difference between the frequency and the other frequency is equal to the inverse of a difference between the first and second delays.

According to an embodiment, a difference between the first and second delays is programmable.

According to an embodiment, each delay is equal to a corresponding whole number of cycles of a clock signal.

According to an embodiment, a frequency of the clock signal is greater than or equal to 50 MHz.

According to an embodiment, the frequency of the first signal is in the range from no KHz to 205 KHz.

According to an embodiment, the first signal is a signal for controlling an antenna, for example, a half-bridge having the antenna connected thereto, and wherein the active state of the flag corresponds to a first binary state of a bit to be transmitted via the antenna and the inactive state of the flag corresponds to a second binary state of the bit to be transmitted via the antenna.

An embodiment provides a wireless charger comprising the described device.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
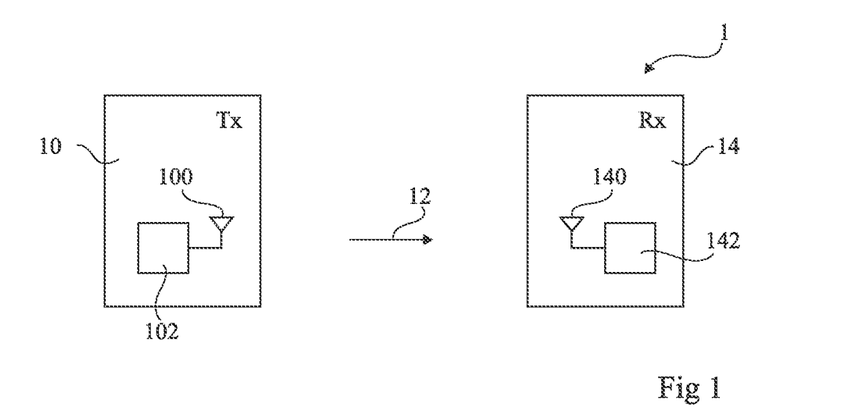
FIG. 1 shows, in the form of blocks, an example of a system comprising a device capable of transmitting a frequency-modulated radio frequency signal and another device capable of receiving the modulated signal.

FIG. 1 shows, in the form of blocks, an example of a system 1 comprising a device 10 (block Tx) capable of transmitting a frequency-modulated radio frequency signal 12, and another device 14 (block Rx) capable of receiving modulated signal 12.

Device 10 comprises an antenna 100 configured to emit frequency-modulated radio frequency signal 12 (here shown in the form of an arrow). Device 10 further comprises a control circuit 102 configured to supply signal 12 to antenna 100 or, in other words, to control antenna wo so that signal 12 is emitted by the latter.

Similarly, device 14 comprises an antenna 140 configured to receive signal 12. Device 14 further comprises a control circuit 142 configured to determine, from the signal 12 received by antenna 140, values of bits transmitted by device 10 to device 14.

In this example, device 10 is further capable of transmitting a wireless power supply to device 14. For this purpose, circuit 102 is further configured to transmit to the antenna a radio frequency signal for powering device 14 or, in other words, to control antenna wo so that it emits a radio frequency magnetic field which, when it is received by antenna 140 of device 14, enables to electrically power device 14, for example, to recharge a battery (not shown) of device 14. Device 10 is then currently called wireless charger.

In this example, device 14 is further configured to modulate the amplitude of the signal 12 emitted by device 10, to transmit data, for example, bits, to device 10. For this purpose, circuit 142 is for example configured to modify the impedance of antenna 140, so that the impedance modification results in a modulation of the amplitude of radio frequency signal 12. Circuit 102 then is, for example, configured to determine, based on the amplitude modulations of signal 12 at the level of antenna 100, the data transmitted by device 14 to device 12.

As an example, the provision of a data transmission from device 10 to device 14, and from device 14 to device 10, in the case where device 10 is a wireless charger, enables devices 10 and 14 to determine the wireless supply power to be delivered by device 10 to device 14.

As an example, the data transmission from device 10 to device 14 by modulating the frequency of signal 12, the data transmission from device 14 to device 10 by modulating the amplitude of signal 12, and the delivery of the supply power to device 14 by device 10 are implemented according to one of versions 1.2.X of the Qi specification developed by the Wireless Power Consortium, or WPC, for example, according to version 1.2.3.

Figure 2:
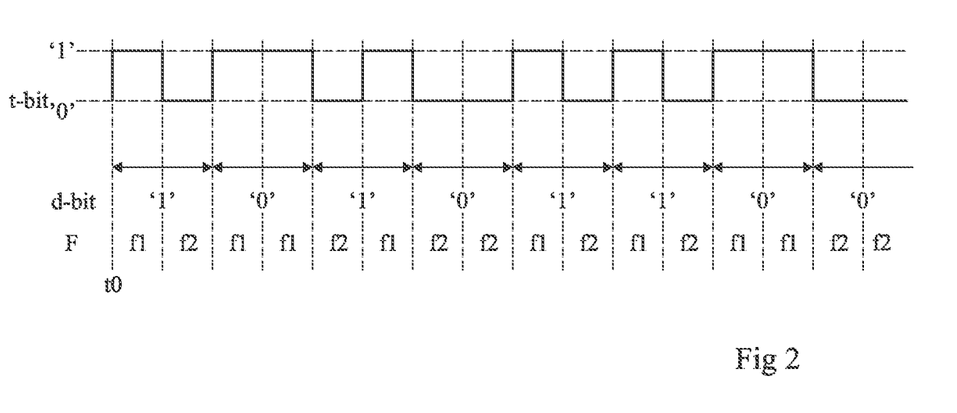
FIG. 2 illustrates, in the form of a timing diagram, an example of a bit transmitted via a frequency-modulated signal.

FIG. 2 illustrates, in the form of a timing diagram, an example of bits transmitted by a frequency-modulated signal, for example, bits t_bit transmitted by frequency-modulated signal 12 (FIG. 1), from device 10 to device 14.

In this example, each bit t_bit at value '1' is transmitted by emitting a given number X of cycles of signal 12 while the frequency F of signal 12 is equal to a frequency f1 and each bit t_bit at value '0' is transmitted by emitting the same number X of cycles of signal 12 while frequency F is equal to a frequency f2, different from frequency f1 As an example, in versions 1.2.X of the Qi specification, number X is, for example, equal to 256.

In the example of FIG. 2, the bits t_bit which are transmitted from a time t0 are successively equal to '1', '0', '1', '1', '0', '1', '0', '0', '1', '1', '1', '0', '1', '1', '0', and '0'. Thus, from time to, the frequency F of signal 12 is successively equal to frequency f1 for 256 cycles or periods of signal 12, to frequency f2 for 256 cycles of signal 12, to frequency f1 for 512 cycles of signal 12, to frequency f2 for 256 cycles of signal 12, to frequency f1 for 256 cycles of signal 12, to frequency f2 for 512 cycles of signal 12, to frequency f1 for 256 cycles of signal 12, to frequency f2 for 256 cycles of signal 12, to frequency f1 for 256 cycles of signal 12, to frequency f2 for 256 cycles of signal 12, to frequency f1 for 512 cycles of signal 12, and to frequency f2 for 512 cycles of signal 12.

In this example, the bits t_bit which are transmitted by signal 12 result from an encoding of the data bits d_bit transmitted by device 10 to device 14. In this example, the encoding used is a differential biphase encoding, for example, a differential Manchester encoding. More particularly, in the present example:

a bit d_bit at '1' is encoded by two successive bits t_bit having opposite values, a bit d_bit at '0' is encoded by two successive bits t_bit having identical values, and for each first and second successive bits d_bit, the first bit t_bit encoding the second bit d_bit to a value opposite to that of the second bit t_bit encoding first bit d_bit.

Thus, in the example of FIG. 2, from time t0, device 10 transmits to device 14 data bits d_bit successively equal to '1', '0', '1', '0', '1', '1', '0', and '0'.

Figure 3:
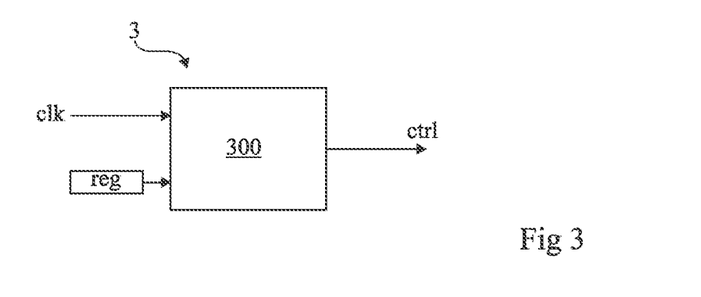
FIG. 3 schematically shows in the form of blocks an example of a circuit capable of generating a frequency-modulated radio frequency signal according to a value of a bit to be transmitted.

FIG. 3 schematically shows in the form of blocks an example of a circuit or device 3 capable of generating a frequency-modulated signal ctrl according to a value of a bit to be transmitted t_bit.

Signal ctrl is a signal for controlling antenna 100 (FIG. 1), having its frequency determining the frequency F of signal 12. Preferably, the frequency F of signal 12 is equal to the frequency of signal ctrl.

As an example, signal ctrl is a signal for controlling a half-bridge having its midpoint coupled to antenna 100 (FIG. 1). More particularly, the half-bridge for example comprises two MOS transistors in series with a node of application of a power supply potential and a node of application of a reference potential, antenna 100, for example, a series association of an inductance and of a capacitor, being connected between the node of connection of two MOS transistors to each other and the node of application of the reference potential or the midpoint of a second half-bridge.

Device 3 comprises a control circuit 300 receiving a clock signal clk. Device 3 is configured to generate signal ctrl in a first state for a first given number n1 of cycles of signal clk, and in a second state for a second number n2 of cycles of signal clk, and then again in the first state for n1 cycles of signal clk etc. Thus, the period of signal ctrl is equal to (n1+n2)*Tclk, Tclk being the period of signal clk.

Values n1 and n2 are stored in registers reg to which circuit 300 has access.

As an example, the frequency F of signal ctrl is equal to value $1/((n1+n2)*Tclk)$ when the bit to be transmitted t_bit is at value '1'. In other words, the frequency f1 of signal ctrl is equal to $1/((n1+n2)*Tclk)$, and a bit t_bit at value '1' is transmitted in X successive cycles of signal ctrl, and thus of signal 12, at frequency f1. To transmit a next bit t_bit at value '0', the frequency F of signal ctrl must be changed so that it is equal to the frequency f2 of the X next cycles of signal ctrl.

For this purpose, it could be devised to modify the period Tclk of signal clk, which would result in a modification of the frequency of signal ctrl. However, such a clock change should be implemented very rapidly, so that at least before the end of the first cycle of signal ctrl corresponding to the transmission of bit t_bit at value '0', the period Tclk of signal clk is equal to $1/((n1+n2)*f2)$).

Such a modification of period Tclk would be implemented by a processor of device 10 (FIG. 1), as soon as a signal indicating that X cycles of signal ctrl have elapsed has been received. Due to the fact that device 10 may implement other functions than those already described, for example, near-field communication or NFC functions, functions of communication via a C-type universal serial bus, or USB-C, which are controlled by the processor, this would impose strong time constraints to the processor, which is not desirable.

Further, in practice, signal clk is obtained by dividing by a whole number the frequency of a periodic signal of higher frequency, for example, a periodic signal supplied by an oscillator. Such an integer division for example enables period Tclk to be equal to $1/((n1+n2)*f1)$. The obtaining of signal clk by an integer division of the periodic signal so that period Tclk is equal to $1/((n1+n2)*f2)$ raises an issue. Indeed, according to the difference between frequencies f1 and f2, this may require for the frequency of the periodic signal to be greater than several GHz, which is not desirable.

As an example, for a frequency f1 equal to no kHz, and a frequency of signal clk equal to 50 MHz, to change the period of signal ctrl by 40 ns so that signal ctrl is at frequency f2, the frequency of signal clk should be capable of being modified by approximately 0.4%. By only using integer divisions of a periodic signal having a frequency higher than that of signal clk, this implies that the frequency of this signal should be equal to at least 227 times the frequency of signal clk, that is, equal to at least 11.35 GHz.

It could then be devised, when period Tclk of signal clk should be equal to $1/((n1+n2)*f2)$, to generate signal clk by dividing the periodic signal of higher frequency by a non-whole decimal number. However, this is not desirable since the implementation of such a division is very complex to implement.

Rather than modifying the period of signal clk, it could be devised to modify the frequency of signal ctrl by modifying the values n1 and/or n2 which are stored in registers reg. However, here again, such a reprogramming of registers reg would be performed by the processor of device 10 (FIG. 1), which would impose unwanted time constraints to the processor. Further, in the case where device 300 would be configured to generate other signals at the same frequency as signal ctrl, but with different waveforms, the number of registers to be reprogrammed would increase, which would further increase the time constraints imposed to the processor.

The above-discussed problems of device 3 are enhanced in the case where the interval between frequencies f1 and f2 may be selected by device 14 (FIG. 1), as for example required by versions 1.2.x of the Qi specification, pages 106 and 107.

The inventor provides a method comprising the execution of a set of successive instructions. As will be seen in further detail hereafter, this method enables to generate frequency-modulated signal ctrl, and thus to emit frequency-modulated signal 12. In this method, each instruction of the set of successive instructions corresponds to (or indicates or represents) a switching of a signal, that is, a signal and a switching of this signal, a delay, and a condition selected from among a first condition, a second condition, and a third condition. The instructions of the set of instructions are executed one after the others. Each instruction is executed as follows.

If the condition corresponding to the executed instruction is the first condition, this means that, whatever the value of the transmitted bit t_bit, the switching of the signal corresponding to the instruction is performed after the delay corresponding to the instruction has elapsed, that is, on expiry of the delay, the delay having as a starting point the last switching of a signal performed on execution of a previous instruction.

If the condition corresponding to the executed instruction is the second condition and a flag is in the active state, the switching of the signal corresponding to the instruction is performed in the same way as when the condition is the first condition.

If the condition corresponding to the executed instruction is the third condition and the flag is in the inactive state, the switching of the signal corresponding to the instruction is performed in the same way as when the condition is the first condition.

If the condition corresponding to the executed instruction is the second condition and the flag is in the inactive state, the switching of the signal corresponding to the instruction is not performed or, in other words, the state of the signal corresponding to the switching is maintained.

Finally, if the condition corresponding to the executed instruction is the third condition and the flag is in the active state, the switching of the signal corresponding to the instruction is not performed or, in other words, the state of the signal corresponding to the switching is maintained.

Further, the set of instructions comprises an instruction representative of a first switching, for example, from the high state to the low state, of signal ctrl, of a first delay, and of the second condition, which is immediately followed by another instruction representative of the same first switching of signal ctrl, of a second delay, and of the third condition. Thus, according to the value of the flag, the first switching of signal ctrl occurs on expiry of the first or of the second delay, which enables to modify the period of signal ctrl according to the state of the flag.

Preferably, the set of instructions comprises another instruction representative of a second switching of signal ctrl, opposite to the first switching, the second switching for example being a switching from the high state to the low state. Thus, each full execution of the set of instructions corresponds to the generation of at least one cycle of signal ctrl.

According to an embodiment, each full execution of the set of instructions corresponds to a cycle or period of signal ctrl.

According to an embodiment, a plurality of full executions of the set of instructions are implemented one after the others or, in other words, successively.

According to an embodiment, the device is in the active state when the bit t_bit to be transmitted is at a first value, for example, value '1', and in the inactive state when the bit t_bit to be transmitted is at a second value, for example, value '0'.

The inventor also provides a device capable of implementing this method. The device comprises a processing circuit configured to execute one after the others the instructions of the set of instructions, and a storage circuit having the set of instructions recorded therein.

Figure 4:
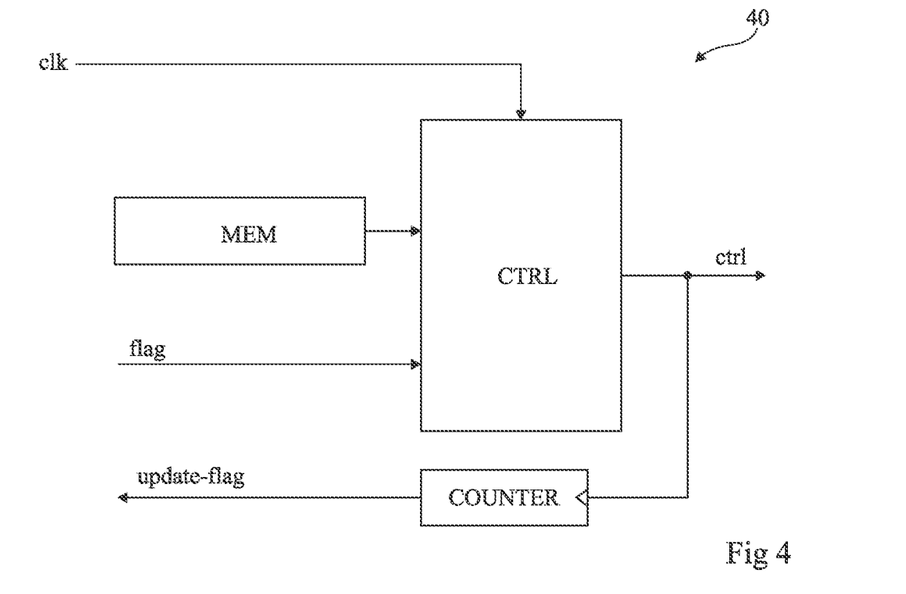
FIG. 4 schematically shows in the form of blocks an embodiment of a device capable of generating a frequency-modulated radio frequency signal according to a value of a bit to be transmitted.

FIG. 4 schematically shows in the form of blocks an embodiment of such a device 40, device 40 being capable of generating frequency-modulated signal ctrl according to the value of a bit t_bit to be transmitted. According to an embodiment, device 40 is implemented in the device 10 of FIG. 1, for example, in circuit 102.

Device 40 comprises a control circuit CTRL configured to execute the instructions of the set of instructions one after the others. Circuit CTRL is, like the circuit 300 of FIG. 3, clocked by clock signal clk.

According to an embodiment, all the delays corresponding to the instructions of the set of instructions each correspond to a number of cycles or periods of signal clk. Thus, circuit CTRL only has to count the number of cycles of signal clk to know when a delay expires. As an example, circuit CTRL comprises a counter configured to count the cycles of signal CLK, the counter being for example reset after each execution of an instruction having resulted in a switching of a signal.

Preferably, the frequency of signal clk is greater than or equal to 50 MHz, which enables, for example, to generate signal ctrl with a frequency f1 in the range from no to 205 kHz, and for the interval between the period of signal ctrl at frequency f1 and the period of signal ctrl at frequency f2 to have minimum values in the order of 40 ns, which is particularly required by versions 1.2.X of the Qi specification.

Device 40 further comprises a storage or memory circuit MEM configured to store the set of instructions. Circuit CTRL has access to the instructions stored in circuit MEM.

Circuit 300 receives the flag, bearing reference flag in FIG. 4.

Further, according to an embodiment, the state of flag flag is updated every X cycles of signal ctrl, for example, every X=256 cycles. For this purpose, device 40 preferably comprises a counter COUNTER configured to count X cycles of signal ctrl and to indicate, for example, by a signal update_flag, when X cycles have been counted and flag flag needs to be updated.

According to an embodiment, device 40 forms part of device 10 (FIG. 1) and the update of flag flag is performed by a processor of device 10 which receives the indication to update flag flag, for example, signal update_flag, from counter COUNTER.

Examples of implementations of the method provided herein, for example, by means of device 40, preferably when device 40 forms part of the device 10 of FIG. 1, will now be described in relation with FIGS. 5 and 6.

Figure 5:
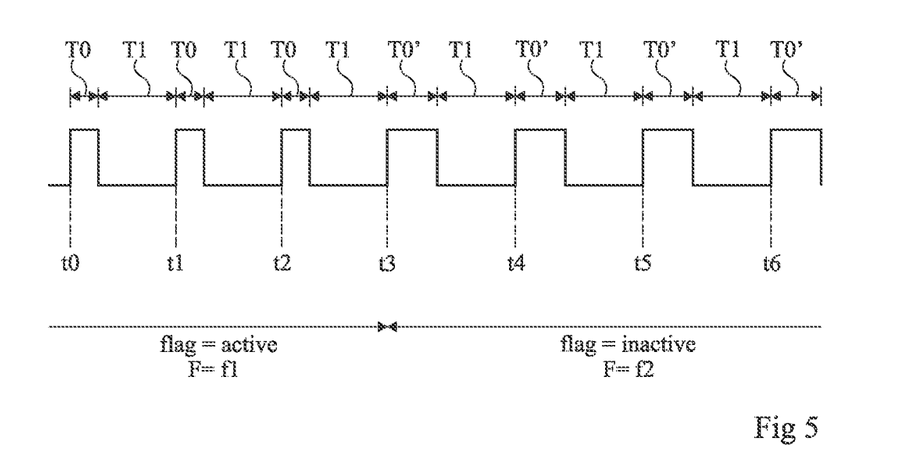
FIG. 5 illustrates, in the form of a timing diagram, an example of a mode of implementation of a method, for example, by the device of FIG. 4.

FIG. 5 illustrates, in the form of a timing diagram, an example of a mode of implementation of the method provided herein, for example, by means of device 40.

In the example of FIG. 5, the set of instructions is formed of successive instructions instr1, instr2, and instr3. These instructions are for example recorded in the circuit MEM of device 40.

Instruction instr1 corresponds to a first switching, in the present example, to the low state, of signal ctrl, to a delay T0, and to the second condition according to which flag flag should be active so that the first switching of signal ctrl is implemented.

Instruction instr2 corresponds to the first switching of signal ctrl, to a delay T0', in the present example greater than delay T0, and to the third condition according to which flag flag should be inactive so that the first switching of signal ctrl is implemented.

Instruction instr3 corresponds to a second switching of signal ctrl, in the present example to the high state, to a delay T1, and to the first condition according to which the second switching should be performed whatever the state of flag flag.

At a time t0, flag flag is active ("flag=active"), which means, in the present example, that a bit t_bit at value '1' is being emitted. Further, time t0 corresponds to the end of a full execution of the set of successive instructions instr1, instr2, and instr3. The last switching performed, at time t0, thus is the switching corresponding to instruction instr3, that is, the switching of signal ctrl to the high state in the present example.

From time t0, instruction instr1 is executed, for example, by the circuit CTRL of device 40. Since flag flag is active, on expiry of delay T0 of instruction instr1, that is, at a time t0+T0, the corresponding switching of signal ctrl is performed, for example, by device 40, and signal ctrl is, in the present example, switched to the low state.

Once instruction instr1 has been executed, at time t0+T0, instruction instr2 is executed, for example, by circuit CTRL. Since flag flag is in the active state, the execution of instruction instr2 causes no switching of signal ctrl.

The execution of the set of successive instructions instr1, instr2, and instr3 carries on with the execution of instruction instr3. The switching of signal ctrl corresponding to instruction instr3 should be performed whatever the state of flag flag on expiry of the delay T1 corresponding to instruction instr3. Delay T1 having as a starting point the switching to the low state of signal ctrl, signal ctrl is switched, in the present example, to the high state, at a time t1 equal to t0+T0+T1.

Between times t0 and t1, the full execution of the set of successive instructions instr1, instr2, and instr3 enables to generate a cycle of signal ctrl. Due to the fact that flag flag is active, frequency F is equal to f1, that is, to 1/(T0+T1) in the present example.

At time t1, the counted number of cycles of signal ctrl is incremented by one. In this example, it is considered that at time t1, X-2 cycles of signal ctrl have already been counted. The state of flag flag is thus not updated, or, in other words, the emission of the current bit t_bit is not finished.

The full execution of the set of instructions is then repeated, from time t1, and a new cycle of signal ctrl is generated between time t1 and a time t2 equal to t1+T0+T1. Since flag flag is active, frequency F remains equal to f1.

At time t2, the counted number of cycles of signal ctrl is incremented by one and becomes equal, in the present example, to X-1. The state of flag flag is thus not updated.

The full execution of the set of instructions is then repeated, from time t2, and a new cycle of signal ctrl is generated between time t2 and a time t3 equal to t2+T0+T1. Since flag flag is active, frequency F remains equal to f1.

At time t3, the counted number of cycles of signal ctrl is incremented and becomes equal to X. The state of flag flag is then updated, in the present example in the inactive state ("flag=inactive"). Time t3 thus corresponds to the end of the emission of a bit t_bit, in the present example at value '1', and to the beginning of the emission of the next bit t_bit, in the present example, at value '0'.

Thus, from time t3, instruction instr1 is executed. Since flag flag is in the inactive state, the execution of instruction instr1 causes no switching of signal ctrl.

The execution of the set of instructions carries on with the execution of instruction instr2. Since flag flag is inactive, on expiry of the delay T0' of instruction instr2, that is, at a time t3+T0', the corresponding switching of signal ctrl is performed and signal ctrl is, in the present example, switched to the low state.

Once instruction instr2 has been executed, instruction instr3 is executed and signal ctrl is switched to the high state at a time t4 equal to t3+T0'+T1.

Between times t3 and t4, the full execution of the set of instructions enables to generate a cycle of signal ctrl. Due to the fact that flag flag is inactive, frequency F is equal to f2, that is, to 1/(T0'+T1) in the present example.

Further, at time t4, the counted number of cycles of signal ctrl is incremented by one and becomes equal to 1. Indeed, as an example, when X cycles of signal ctrl have been counted, the counter COUNTER of device 40 is reset, either in autonomous fashion or under control of another circuit, for example, by the processor which receives signal update_flag.

The full execution of the set of instructions is then repeated, from time t4, and a new cycle of signal ctrl is generated between time t4 and a time t5 equal to t4+T0'+T1. Since flag flag is inactive, frequency F remains equal to f2.

The full execution of the set of instructions is then repeated, from time t5. Since flag flag is in the inactive state, a new cycle of signal ctrl is generated between time t5 and a time t6 equal to t5+T0'+T1, frequency F being remaining equal to f2.

In the example of FIG. 5, the frequency F of signal ctrl is equal to frequency f1=1/(T0+T1) until time t3, which corresponds to the transmission of a bit t_bit at a first value, in the present example, value '1', and is equal to frequency f2=1/(T0'+1) from time t3, which corresponds to the transmission of a bit t_bit at a second value, in the present example, value '0'.

An example where all the instructions of the set of instructions concern the switching of a same signal, that is, signal ctrl, has been described in relation with FIG. 5. In other examples, the instructions of the set of instructions may concern the switching of a plurality of different signals. In particular, an instruction may concern a plurality of signals and the switching of these signals. This enables to generate, for example, by means of device 40, a plurality of different periodic signals, preferably at the same frequency, as will now be illustrated in FIG. 6.

Figure 6:
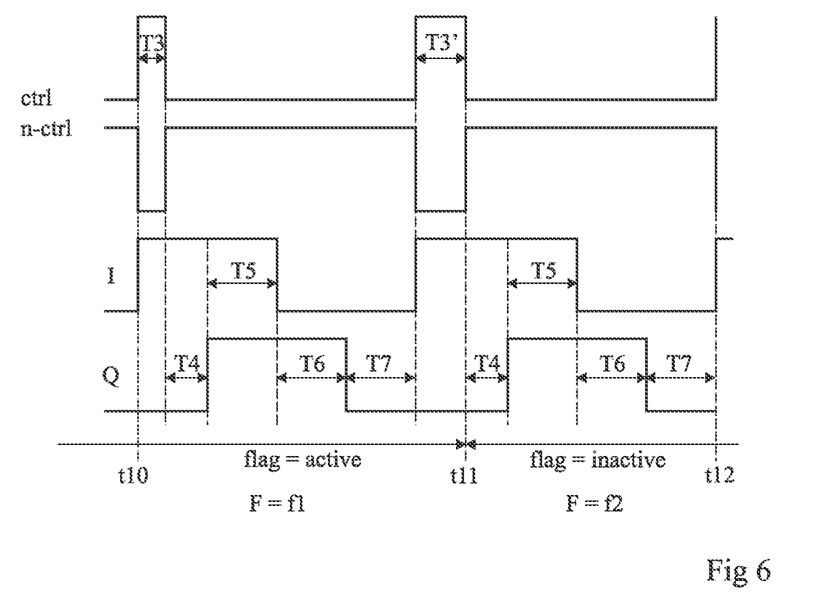
FIG. 6 illustrates, in the form of timing diagrams, another example of a mode of implementation of a method, for example, by the device of FIG. 4.

FIG. 6 illustrates, in the form of timing diagrams, another example of an implementation mode of the method provided herein, for example, by means of device 40.

In the example of FIG. 6, the set of instructions is formed of the successive instructions instr4, instr5, and instr6, instr7, instr8, and instr9. The instructions are for example recorded in the circuit MEM of device 40. This set of instructions enables to simultaneously generate 4 signals ctrl, n_ctrl, I, and Q. Signals I and Q are for example used to demodulate the amplitude-modulated signal 12 seen by device 10 at the level of antenna 100 (FIG. 1).

Instruction instr4 corresponds to a switching to the low state of signal ctrl, to a switching to the high state of signal n_ctrl, to a delay T3, and to the second condition.

Instruction instr5 corresponds to a switching to the low state of signal ctrl, to a switching to the high state of signal n_ctrl, to a delay T3', and to the second condition.

Instruction instr6 corresponds to a switching to the high state of signal Q, to a delay T4, and to the first condition.

Instruction instr7 corresponds to a switching to the low state of signal I, to a delay T5, and to the first condition.

Instruction instr8 corresponds to a switching to the low state of signal Q, to a delay T6, and to the first condition.

Instruction instr9 corresponds to a switching to the high state of signal ctrl, to a switching to the low state of signal n_ctrl, to a switching to the high state of signal I, to a delay T7, and to the first condition.

It is considered as an example that the execution of the set of instructions starts at a time t10 when signals ctrl, n_ctrl, I, and Q are respectively in the high state, in the low state, in the high state, and in the low state. Further, in this example, at time t10, flag flag is active ("flag=active") to transmit a bit t_bit at a first value, for example, value '1'. It is also considered as an example that time t10 corresponds to the beginning of the last one of the X cycles of the signal ctrl corresponding to the transmission of bit t_bit.

From time t10, since flag flag is active, the execution of instruction instr4 results in a switching of signal ctrl to the low state at a time equal to t10+T3, and, simultaneously, to a switching to the high state of signal n_ctrl.

Since flag flag is active, the execution of the next instruction instr5 results in no switching.

The execution of the next instruction instr6 results in a switching to the high state of signal Q, at a time equal to t10+T3+T4.

The execution of the next instruction instr7 results in a switching to the low state of signal I, at a time equal to t10+T3+T4+T5.

The execution of the next instruction instr8 results in a switching to the low state of signal Q, at a time equal to t10+T3+T4+T5+T6.

Finally, the execution of the next instruction instr9 results, simultaneously, in a switching to the high state of signal ctrl, in a switching to the low state of signal n_ctrl, and in a switching to the high state of signal I, at a time t11 equal to t10+T3+T4+T5+T6+T7.

Between times t10 and t11, the full execution of the set of instructions enables to generate a cycle of signal ctrl, and, simultaneously, a cycle of signal n_ctrl, a cycle of signal I, and a cycle of signal Q. Since flag flag is active, the frequency F of signal ctrl is equal to f1, frequency f1 being equal to 1/(T3+T4+T5+T6+T7) in the present example.

At time t11, the counted number of cycles of signal ctrl is incremented and becomes equal to X. Flag flag is then updated, in the present example to the inactive state ("flag=inactive").

From time t11, a new full execution of the set of instructions starts.

Since flag flag is inactive, the execution of the next instruction instr4 results in no switching.

The execution carries on with the execution of the next instruction instr5. Since flag flag is active, the execution of instruction instr5 results, at a time equal to t11+T3', simultaneously in a switching to the low state of signal ctrl and in a switching to the high state of signal n_ctrl.

The execution of the successive instructions instr6, instr7, instr8, and instr9 successively results in a switching to the high state of signal Q at a time equal to t11+T3'+T4, in a switching to the low state of signal I at a time equal to t11+T3'+T4+T5, in a switching to the low state of signal Q at a time equal to t11+T3'+T4+T5+T6, and, simultaneously, in a switching to the high state of signal ctrl, in a switching to the low state of signal n_ctrl and in a switching to the high state of signal I at a time t12 equal to t11+T3'+T4+T5+T6+T7.

Between times t11 and t12, the full execution of the set of instructions enables to generate a cycle of signal ctrl, and, simultaneously, a cycle of signal n_ctrl, a cycle of signal I, and a cycle of signal Q. Since flag flag is inactive, the frequency F of signal ctrl is equal f2, frequency f2 being equal to 1/(T3'+T4+T5+T6+T7) in the present example.

It should be noted that at time t11, the counted number of cycles of signal ctrl is incremented but remains smaller than number X. Flag flag is thus not updated.

Figure 7:
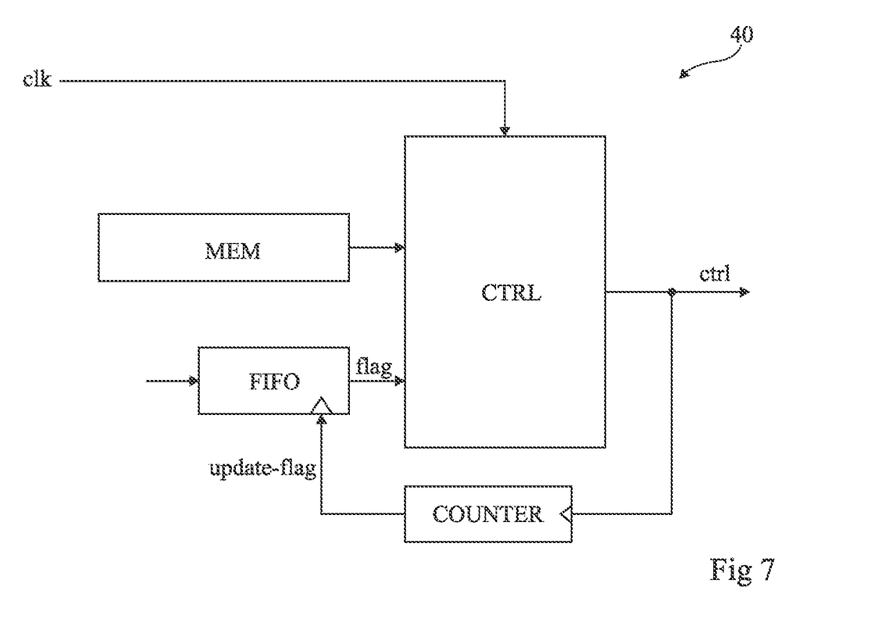
FIG. 7 schematically shows in the form of blocks an alternative embodiment of the device of FIG. 4.

FIG. 7 schematically shows in the form of blocks an alternative embodiment of the device 40 of FIG. 4.

In FIG. 7, device 40 further comprises a queue FIFO, for example, a queue of "first in—first out" type, where next successive states of flag flag are stored.

Device 40 is then configured to update the current state of flag flag with the next state of flag flag which is stored in queue FIFO when the given number of cycles has been reached, signal update_flag being representative of this indication.

Thus, in this embodiment, rather than the processor of device 10 updating the state of flag flag each time counter COUNTER indicates, via signal update_flag, that X cycles of signal ctrl have been counted, the processor may load a plurality of next successive states into queue FIFO. Thereby, when counter COUNTER indicates, via signal update_flag, that X cycles of signal ctrl have been counted, the current state of the flag is updated with the next state stored in queue FIFO, without interrupting the processor.

In the example of FIG. 7, the current state of flag flag is available at the output of queue FIFO, which is coupled to circuit CTRL. Further, queue FIFO is controlled, at least partly, by signal update_flag, so that queue FIFO updates its output each time COUNTER indicates that X cycles of signal ctrl have been counted. As an example, queue FIFO receives signal update_flag.

In another example, not shown, circuit 300 receives signal update_flag and is configured to control the update of the output of queue FIFO.

In the above-described embodiments and variants, preferably, the instructions of the set of instructions are configured so that each periodic signal generated by successive full executions of the set of instructions is switched exactly once to the low state and exactly once to the high state for each full execution of the set of instructions.

Further, in the above-described embodiments and variants, preferably, the interval or difference ΔT between two delays corresponding to the two instructions which each aim at the same switching of the same signal, but which respectively indicate the second condition and the third condition, is programmable. Applying to the example of FIG. 5, this means that the interval ΔT between delays T0 and T0' is programmable, and, applying to the example of FIG. 6, this means that interval ΔT between delays T3 and T3' is programmable. In other words, in the example of FIG. 5, delays T0 and T0' are programmable, and, in the example of FIG. 6, delays T3 and T3' are programmable.

Thereby, the interval between frequencies f1 and f2 may be reprogrammed by only reprogramming interval ΔT or the concerned instruction, and not the entire set of instructions. Preferably, interval ΔT corresponds to a whole number of clock cycles.

The provision of a programmable interval ΔT is for example advantageous when one of the versions 1.2.X of the Qi specification is implemented since the interval between frequencies f1 and f2 is selected by the device, for example, the device 14 of FIG. 1, which receives frequency-modulated signal 12.

Various embodiments and variants have been described. Those skilled in the art will understand that certain features of these various embodiments and variants may be combined, and other variants will occur to those skilled in the art. In particular, it will be within the abilities of those skilled in the art to provide other sets of successive instructions than those discussed as an example in relation with FIGS. 5 and 6. Further, the present disclosure is not limited to the case where X is equal to 256, or to the case where the transmitted bits t_bit result from an encoding of data bits d_bit according to a differential biphase Manchester encoding. Further, it will be within the abilities of those skilled in the art to modify the state of flag flag which corresponds to a bit t_bit transmitted at value '1' as compared with what has been described as an example.

Finally, the practical implementation of the described embodiments and variations is within the abilities of those skilled in the art based on the functional indications given hereabove. In particular, the implementation of device 40, particularly of circuit CTRL, is within the abilities of those skilled in the art based on the functional indications given hereabove. As an example, circuit CTRL comprises a state machine, for example, a state machine comprising a first portion responsible for the execution of the instructions and a second state machine responsible for the reading of the instructions. The first portion of the state machine is for example configured to implement the execution of a current instruction supplied by the second portion of the state machine, that is, it waits for the delay of the instruction to have elapsed before implementing the switching(s) of the instruction. The second portion of the state machine is for example configured to search, based on the instruction being executed, for the next instruction effectively resulting in a switching of a signal, while ignoring those which would not result in a switching of a signal due to the current state of the flag, and to supply the next instruction to the first portion of the state machine.

What is claimed is:

1. A method of executing a set of successive instructions stored in a storage circuit, each instruction corresponding to a switching of a signal, a delay, and a condition selected among first, second, or third conditions, and each instruction execution comprising either performing, after the delay has expired, the switching of the signal in response to the condition being the first condition, the condition being the second condition and a flag being in an active state, or the condition being the third condition and the flag being in an inactive state, or not performing the switching in response to the condition being the second condition and the flag being in the inactive state or the condition being the third condition and the flag being in the active state, the method comprising:
executing a first instruction stored in the storage circuit, the first instruction representative of a first switching of a first signal, a first delay, and the second condition; and
immediately following the executing the first instruction, executing a second instruction stored in the storage circuit, the second instruction representative of the first switching of the first signal, a second delay, and the third condition.

2. The method according to claim 1, further comprising implementing multiple executions of the set of successive instructions one after the other.

3. The method according to claim 1, wherein each full execution of the set of successive instructions corresponds to a cycle of the first signal, the first signal being periodic.

4. The method according to claim 3, further comprising updating a current state of the flag each time a given number of cycles of the first signal is reached.

5. The method according to claim 4, further comprising storing next successive states of the flag in a queue.

6. The method according to claim 4, further comprising:
counting, by a counter, the given number of cycles of the first signal;
indicating, by the counter, that the given number of cycles has been reached; and
updating the flag in response to the given number of cycles being reached.

7. The method according to claim 1, further comprising:
determining a first frequency of the first signal based on the active state of the flag; and
determining a second frequency of the first signal based on the inactive state of the flag.

8. The method according to claim 7, wherein a difference between the first frequency and the second frequency is equal to an inverse of a difference between the first and second delays.

9. The method according to claim 1, wherein a difference between the first and second delays is programmable.

10. The method according to claim 1, wherein each delay is equal to a corresponding whole number of cycles of a clock signal.

11. The method according to claim 10, wherein a frequency of the clock signal is greater than or equal to 50 MHz.

12. The method according to claim 1, wherein a frequency of the first signal is in a range from 110 kHz to 205 kHz.

13. The method according to claim 1, further comprising controlling an antenna with the first signal, the active state of the flag corresponding to a first binary state of a bit to be transmitted via the antenna, and the inactive state of the flag corresponding to a second binary state of the bit to be transmitted via the antenna.

14. A device comprising:
a storage circuit having a set of successive instructions stored therein, wherein each instruction corresponds to a switching of a signal, a delay, and a condition selected among first, second, or third conditions, and wherein an execution of each instruction comprises either performing, after the delay has expired, the switching of the signal in response to the condition being the first condition, the condition being the second condition and a flag being in an active state, or the condition being the third condition and the flag being in an inactive state, or not performing the switching in response to the condition being the second condition and the flag being in the inactive state or the condition being the third condition and the flag being in the active state; and
a processing circuit configured to:
execute a first instruction stored in the storage circuit, the first instruction representative of a first switching of a first signal, a first delay, and the second condition; and
immediately following execution of the first instruction, execute a second instruction stored in the storage circuit, the second instruction representative of the first switching of the first signal, a second delay, and the third condition.

15. The device according to claim 14, wherein multiple executions of the set of successive instructions are implemented one after the other.

16. The device according to claim 14, wherein each full execution of the set of successive instructions corresponds to a cycle of the first signal, the first signal being periodic.

17. The device according to claim 16, wherein a current state of the flag is updated each time a given number of cycles of the first signal is reached.

18. The device according to claim 17, further comprising a counter configured to count the given number of cycles of the first signal and to indicate that the given number of cycles has been reached, wherein the device is configured to update the flag when the given number of cycles has been reached.

19. The device according to claim 14, wherein the active state of the flag determines a first frequency of the first signal, and the inactive state of the flag determines a second frequency of the first signal.

20. The device according to claim 14, wherein a difference between the first and second delays is programmable.

21. The device according to claim 14, wherein the first signal is configured to control an antenna, wherein the active state of the flag corresponds to a first binary state of a bit to be transmitted via the antenna, and wherein the inactive state of the flag corresponds to a second binary state of the bit to be transmitted via the antenna.

22. A wireless charger comprising:
a storage circuit having a set of successive instructions stored therein, wherein each instruction corresponds to a switching of a signal, a delay, and a condition selected among first, second, or third conditions, and wherein an execution of each instruction comprises either performing, after the delay has expired, the switching of the signal in response to the condition being the first condition, the condition being the second condition and a flag being in an active state, or the condition being the third condition and the flag being in an inactive state, or not performing the switching in response to the condition being the second condition and the flag being in the inactive state or the condition being the third condition and the flag being in the active state;
a processing circuit configured to:
execute a first instruction stored in the storage circuit, the first instruction representative of a first switching of a first signal, a first delay, and the second condition; and immediately following execution of the first instruction, execute a second instruction stored in the storage circuit, the second instruction representative of the first switching of the first signal, a second delay, and the third condition; and an antenna configured to be controlled by the first signal.

* * * * *